United States Patent [19]

Billman et al.

[11] Patent Number: 4,824,392

[45] Date of Patent: Apr. 25, 1989

[54] BURN-IN SOCKET FOR GULL WING INTEGRATED CIRCUIT PACKAGE

[75] Inventors: Timothy B. Billman, King; Joseph R. Goodman, Walkertown, both of N.C.

[73] Assignee: AMP Incorporated, Harrisburg, Pa.

[21] Appl. No.: 118,916

[22] Filed: Nov. 10, 1987

[51] Int. Cl.⁴ .............................................. H01R 9/09
[52] U.S. Cl. ...................................... 439/331; 439/73; 439/372
[58] Field of Search ................................... 439/68–73, 439/264, 330, 331, 372

[56] References Cited

U.S. PATENT DOCUMENTS

| | | |
|---|---|---|
| 3,865,458 | 2/1975 | Pauza et al. . |
| 3,883,207 | 5/1975 | Tomkiewicz ..................... 439/264 |
| 4,278,311 | 7/1981 | Scheingold et al. . |
| 4,345,810 | 8/1982 | Bakermans . |
| 4,359,252 | 11/1982 | Olsson et al. . |
| 4,376,560 | 3/1983 | Olsson et al. . |
| 4,433,886 | 2/1984 | Cassarly et al. ..................... 439/71 |
| 4,449,770 | 5/1984 | Grabbe et al. . |
| 4,494,807 | 1/1985 | Cosmo . |
| 4,498,721 | 2/1985 | van Dijk . |
| 4,502,747 | 3/1985 | Bright et al. . |
| 4,511,197 | 4/1985 | Grabbe et al. . |
| 4,513,353 | 4/1985 | Bakermans et al. . |
| 4,571,015 | 2/1986 | Mueller . |
| 4,621,884 | 11/1986 | Berkebile, Jr. et al. . |
| 4,647,124 | 3/1987 | Kandybowski . |
| 4,750,890 | 6/1988 | Dube et al. ..................... 439/330 X |

*Primary Examiner*—Paul Gensler
*Attorney, Agent, or Firm*—Eric J. Groen

[57] ABSTRACT

Four embodiments of a burn-in socket for gull wing configured semiconductor packages are disclosed where each of the embodiments includes latching means which a mechanical advantage assisting in the installation of the carrier and package. Two of the embodiments include four centered posts which include helical ramparts which contact directly on the upper surface of the carrier. A third embodiment is disclosed which includes a lid which rotates over the upper face of the carrier, where the cover includes a post having a helical rampart where the helical rampart contacts a shoulder of the socket which lowers the cover. The fourth embodiment discloses two overlapping doors where the outer door contacts the inner door thereby closing the inner door moving the carrier downward.

7 Claims, 11 Drawing Sheets

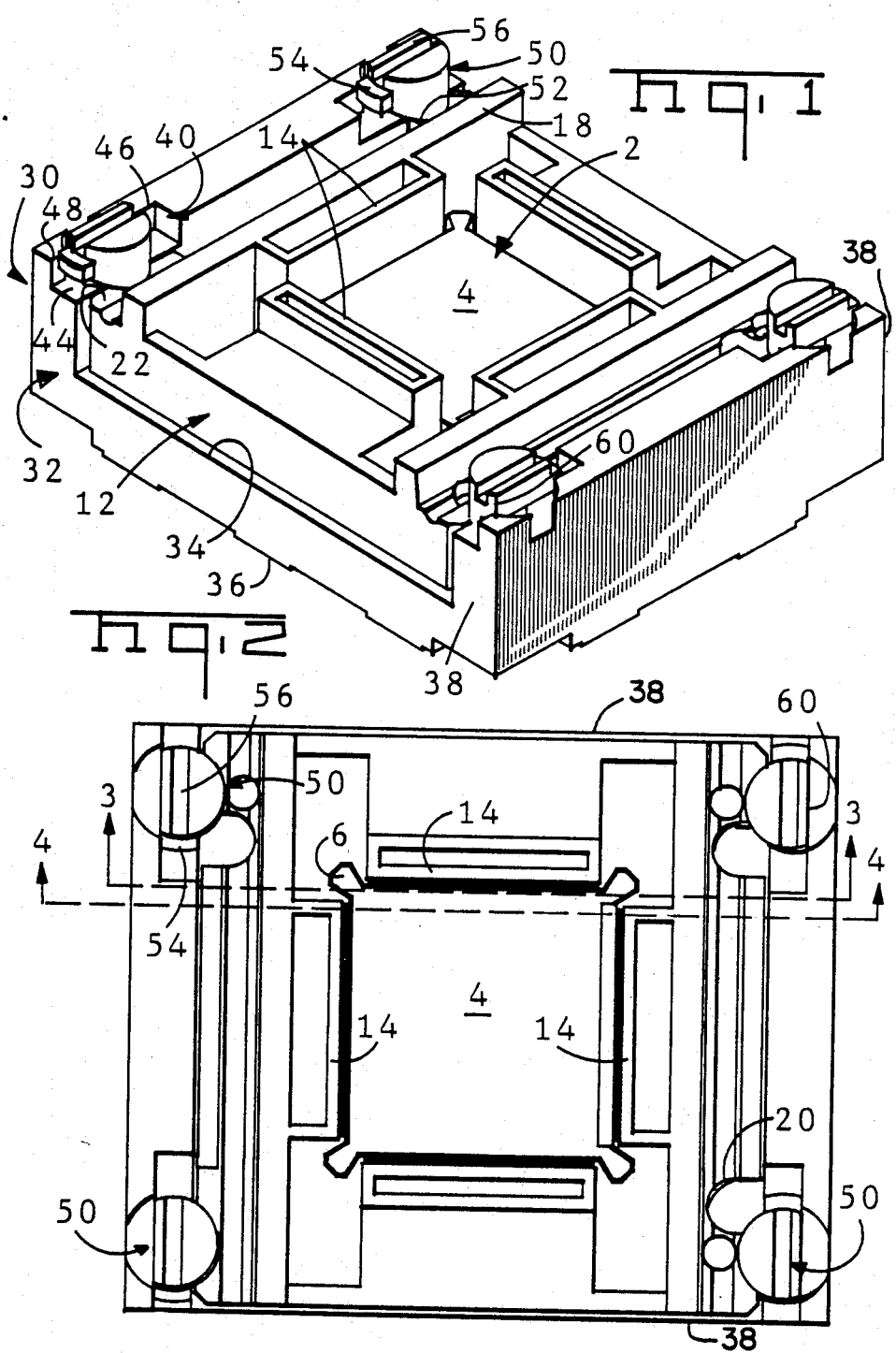

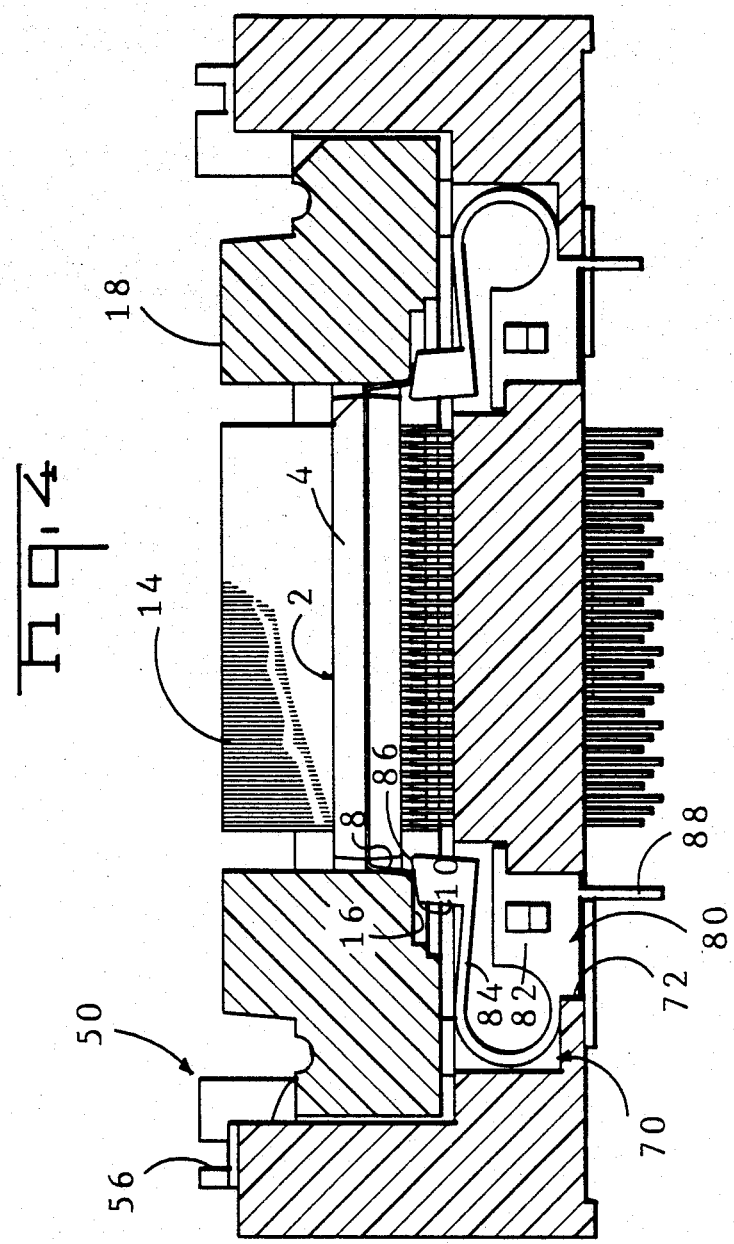

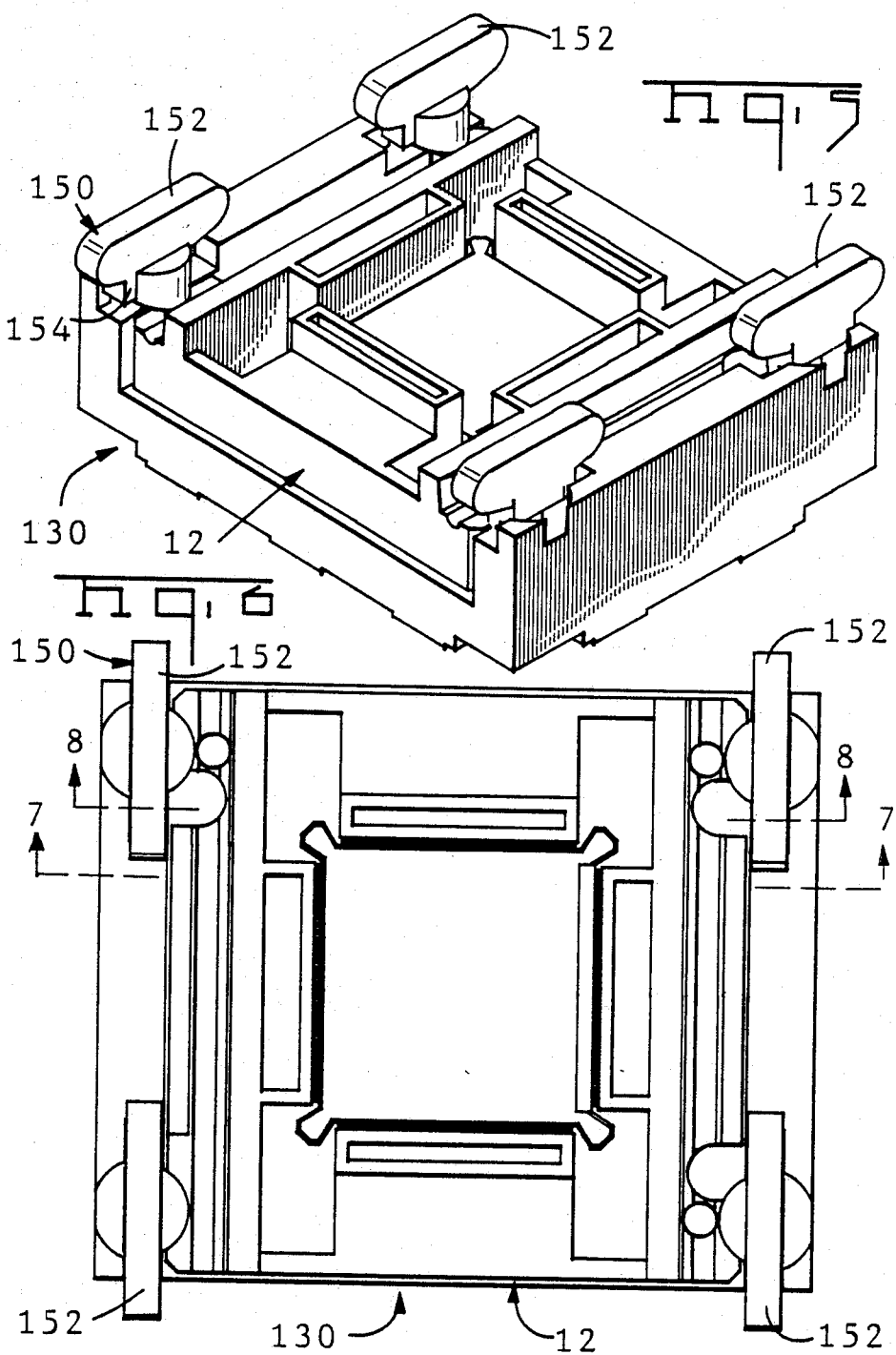

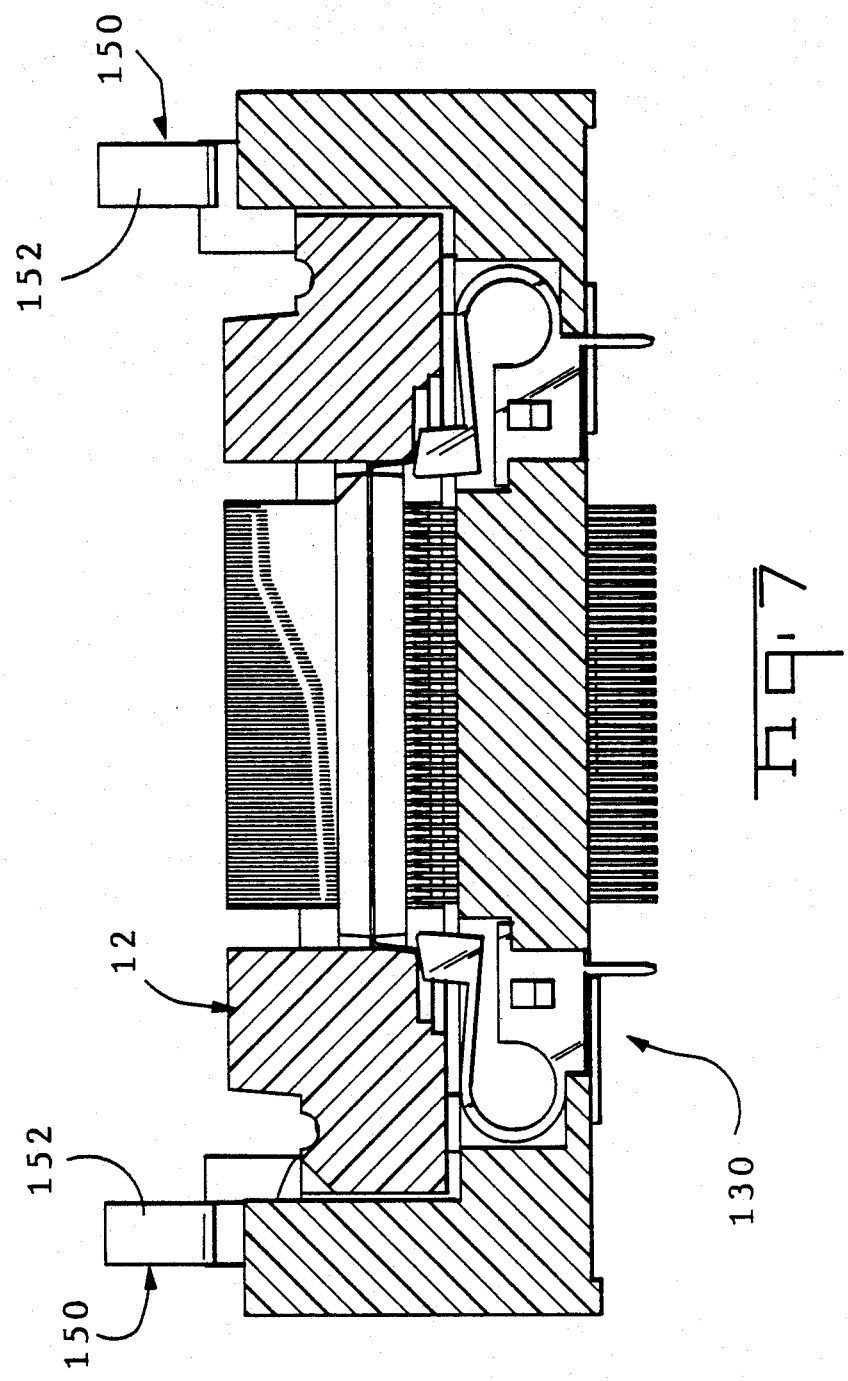

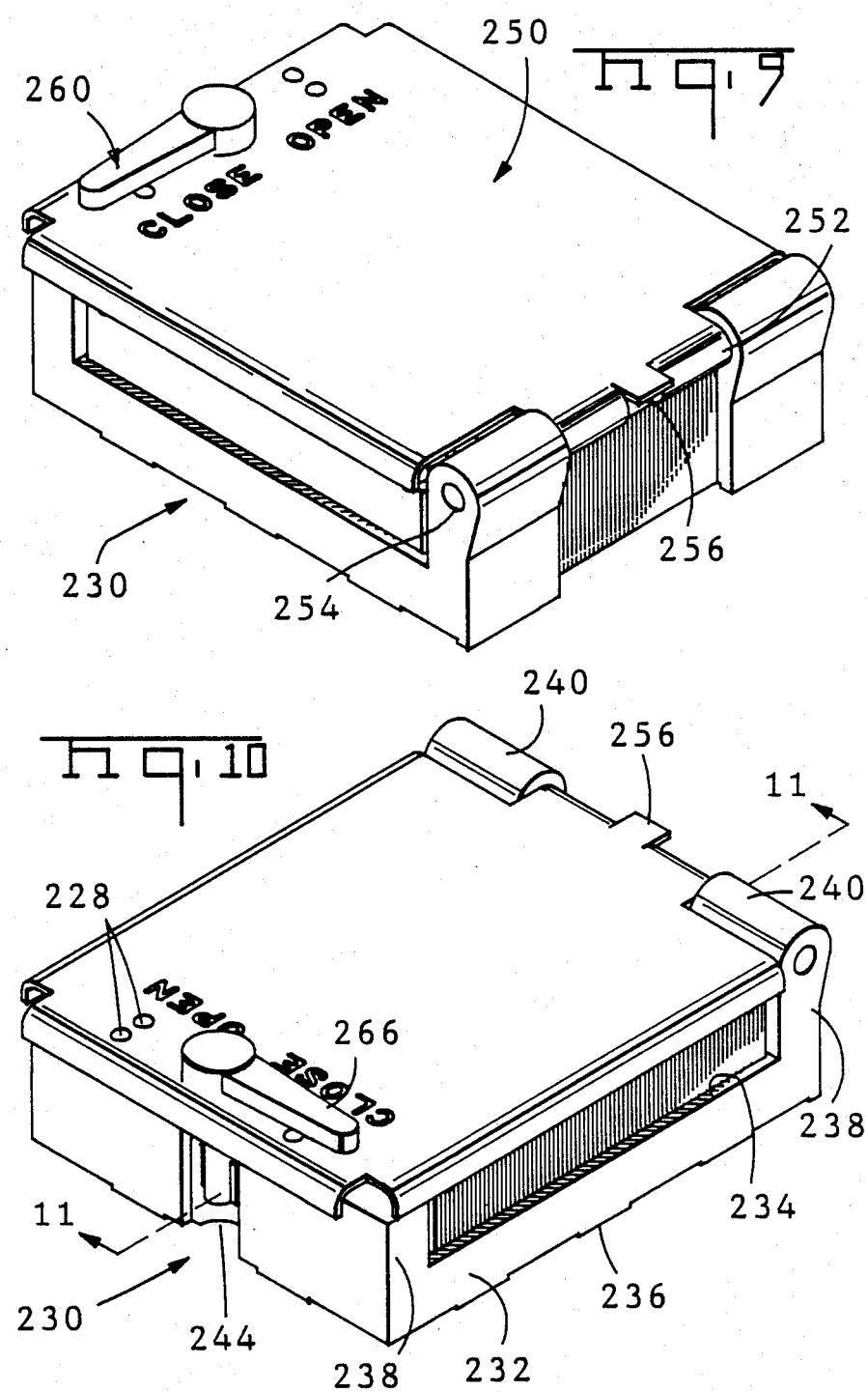

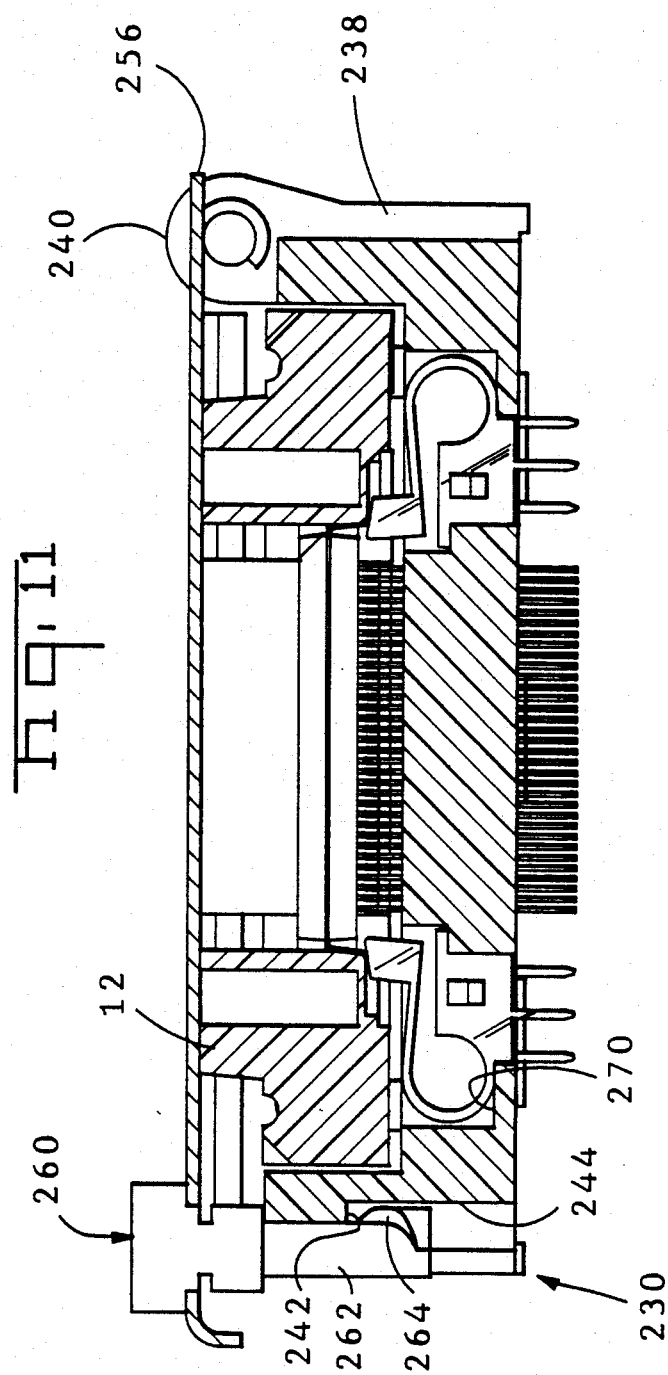

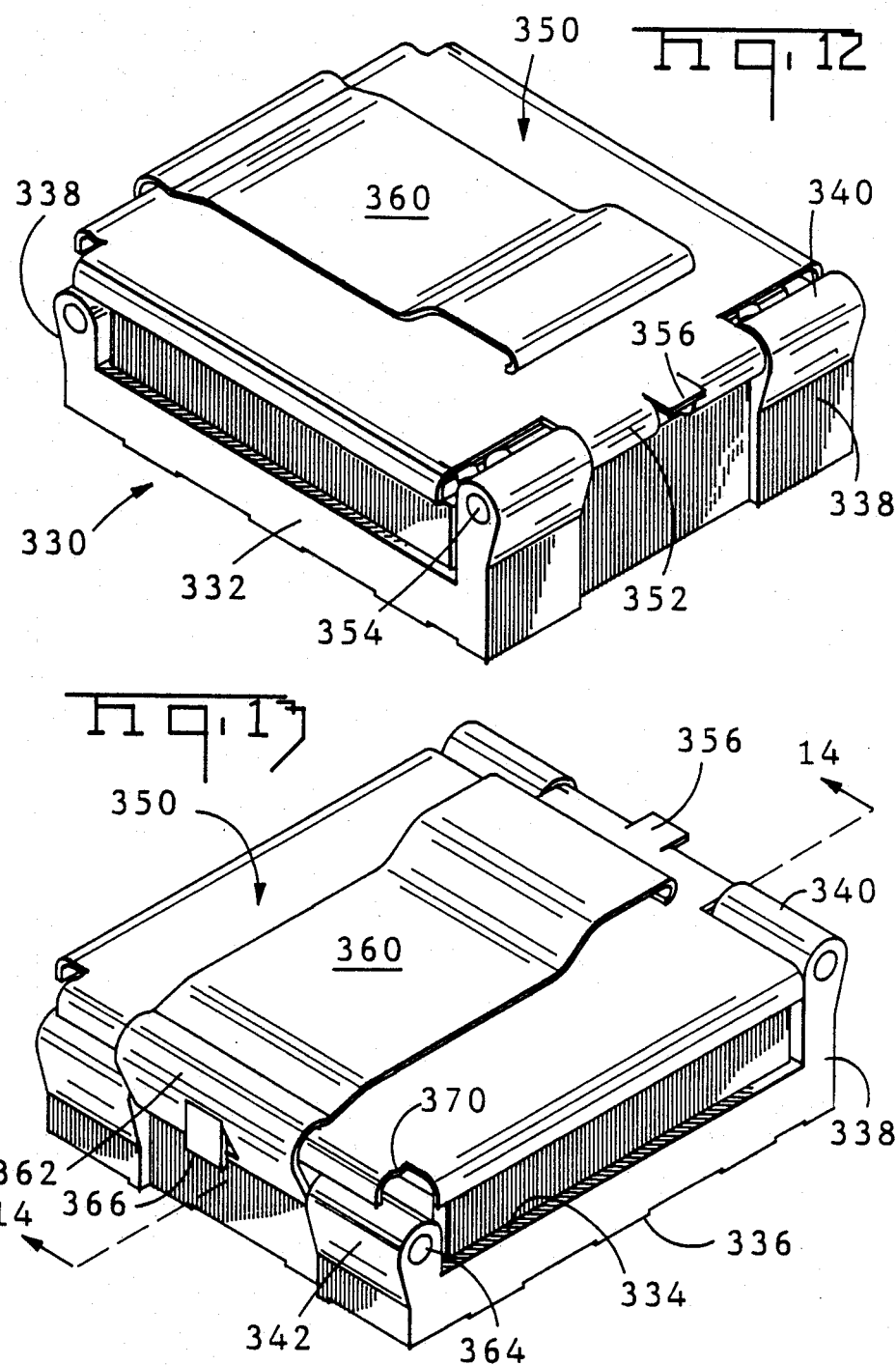

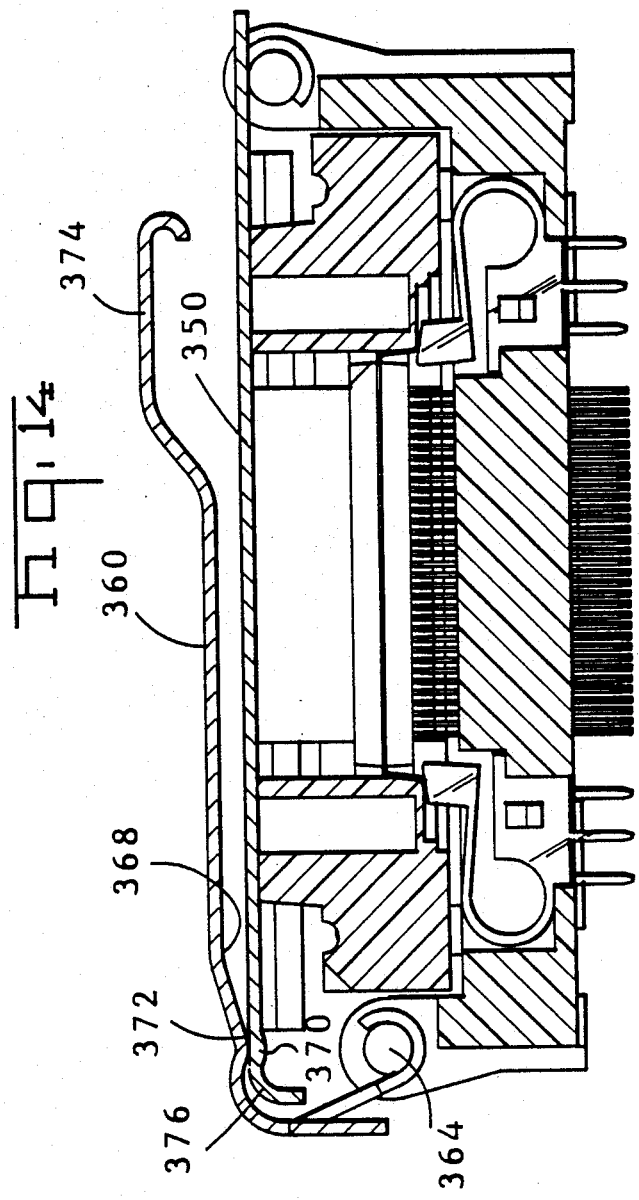

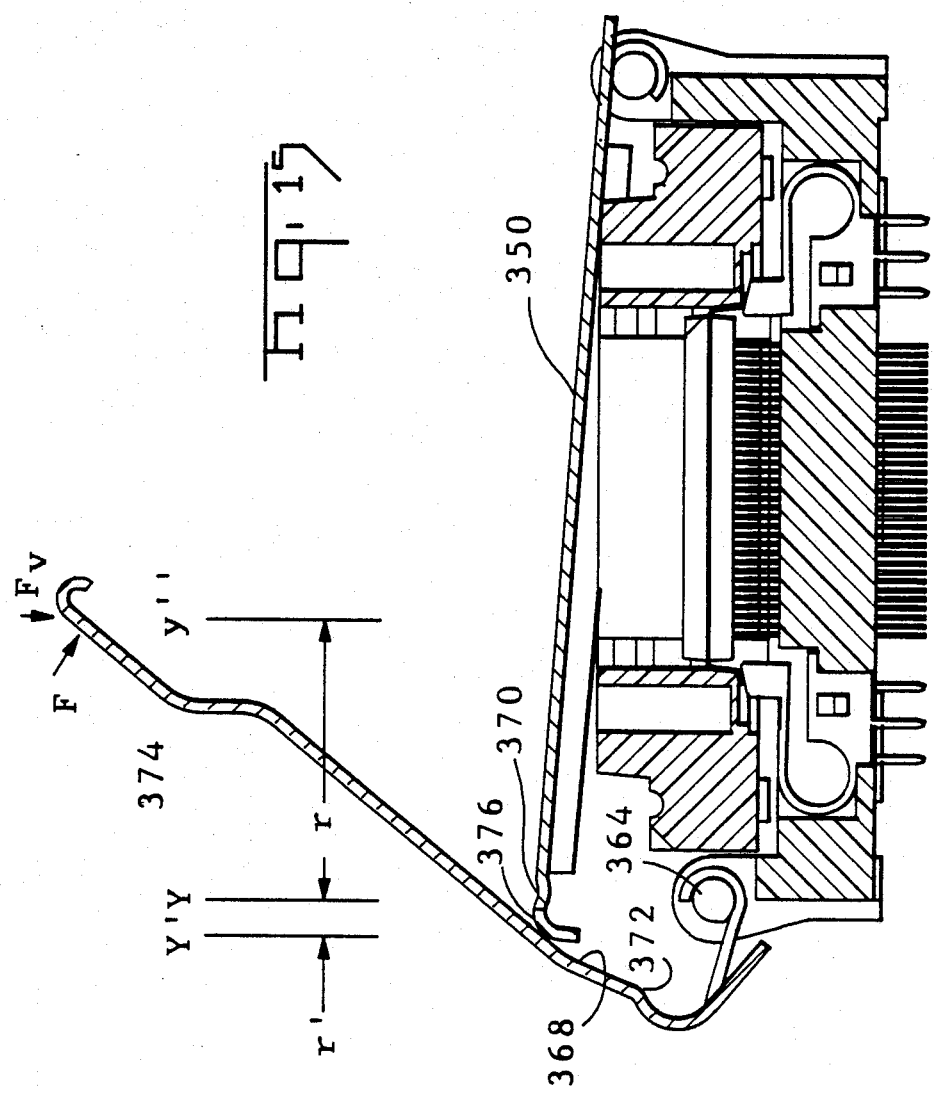

BURN-IN SOCKET FOR GULL WING INTEGRATED CIRCUIT PACKAGE

BACKGROUND OF THE INVENTION

1. Field of the Invention

The subject invention relates to a burn-in socket for a gull wing semiconductor package.

2. Description of the Prior Art

Semiconductor packages are arranged with several lead configurations denoting their use. One such semiconductor package is known as the gull wing package and includes a plurality of leads extending from the package body from all four side edges of the package body and all leads extending outwardly from a common flat plane. The leads are then bent downwardly and then flattened to form a foot which are in a plane which is beneath the bottom surface of the package body.

Typically, all semiconductor packages are tested in some manner to ensure their proper functioning, including burn-in testing where the devices are inserted into sockets and installed within large convection ovens and the packages are operated at elevated temperatures.

The package known as the gull wing semiconductor is a very fragile component and, as such, the package is typically installed within a carrier which includes an insulative housing to surround the package body. The carrier is placed within the socket during the burn-in testing and, when completed, the carrier and package are removed and the semiconductor package is shipped within the carrier for protection of the package leads.

Semiconductor packages are now being manufactured in the four sided gull wing configuration with the lateral centerline between adjacent leads spaced apart 0.025 inches with as many as 244 leads extending from the package body. With an insertion force on each lead being approximately 0.25 pounds, the total insertion force for such a semiconductor package would be as high as 61 pounds total. The problem which resultantly exists is the necessity of an insertion and latching means which can progressively install the package leads yet maintain and retain the semiconductor package in an electrically connected condition with the terminals of the burn-in socket.

Burn-in sockets presently available require the semiconductor package and the carrier to be inserted within the sockets and require the installer to exert a force directed onto the package carrier to a position where the package carrier clears a latching mechanism. Two problems are presented by this arrangement.

First, burn-in cycling requires a massive "burn-in board" which is a printed circuit board having densely packed burn-in sockets aligned side-by-side and end-to-end on the board. To require the installer to insert this small semiconductor and carrier within the sockets requires a great deal of dexterity, as the carriers are in the range of one and one inches square, and also requires a lot of physical strength given that the force of 60 pounds must be concentrated on that small of a carrier.

Secondly, the contacts within the sockets can easily be damaged by the installer. If the carrier is over extended within the socket housing, the contacts can be overstressed to the point of plastic deformation.

No such sockets are known to be available which assist in the insertion of the carrier to effect the electrical connection between the semiconductor package leads and the electrical terminals of the burn-in socket.

SUMMARY OF THE INVENTION

It is an object of the instant invention to design such a semiconductor burn-in package where latching means are included which include a mechanical advantage such that the latch means can resultantly contact the carrier and the contact point of the latch can be moved through a relatively long distance to effect a force vertically downward on the carrier member to bring semiconductor package leads into electrical connection with terminals of the burn-in socket.

It is a further object of the instant invention to include, within the latch means, means to lock the carrier in place to retain the semiconductor package leads to electrical connection with the burn-in socket terminals.

The objects of the invention were met by incorporating within the electrical burn-in socket an insulative housing having an upper package receiving face and a lower mounting face where the housing has a plurality of laterally spaced terminal receiving cavities extending between the faces. A plurality of electrical terminals are positioned within the cavities and the terminals include portions extending beyond the lower face for contact with the printed circuit board and further includes resilient contact portions which extend upwardly with at least a portion of the contact above the upper face. The burn-in socket also includes latching means mounted to the connector and rotated relative thereto. The latching means include a contacting surface means spaced from an axis of rotation for imparting a downward vertical force on the carrier to effect electrical connection between the package leads and the electrical terminals.

The invention will now be described in view of the following figures.

BRIEF DESCRIPTION OF THE DRAWINGS

FIG. 1 shows an isometric view of the first embodiment.

FIG. 2 shows an upper plan view of the first embodiment.

FIG. 3 shows a cross-sectional view through lines 3—3 of FIG. 2.

FIG. 4 is a cross-sectional view through lines 4—4 of FIG. 2.

FIG. 5 is an isometric view of a second embodiment.

FIG. 6 is an upper plan view of the second embodiment.

FIGS. 9 and 10 are isometric views of the third embodiment.

FIG. 11 is a cross-sectional view taken through lines 11—11 of FIG. 10.

FIGS. 12 and 13 are isometric views of the fourth embodiment.

FIG. 14 is a cross-sectional view taken through lines 14—14 of FIG. 13, without the covers being shown in section.

FIG. 15 is a view similar to FIG. 14 showing the two covers at a first moment of contact between the covers.

DETAILED DESCRIPTION OF THE PREFERRED EMBODIMENT

Figure 7:
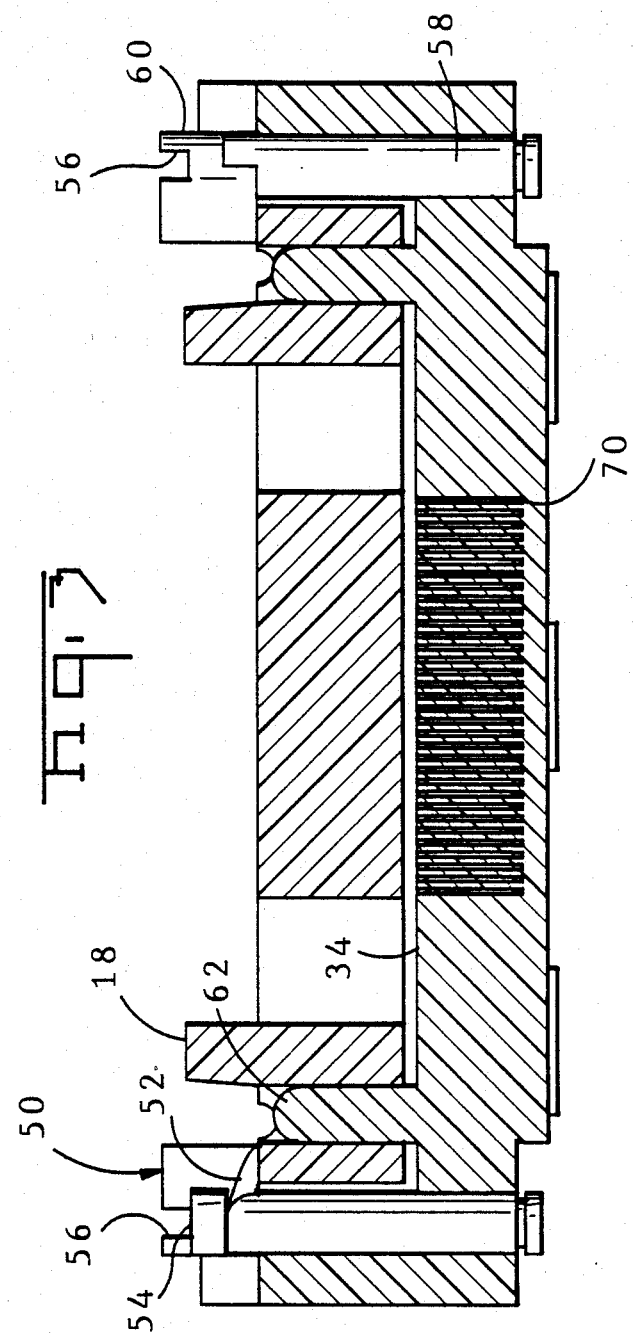
FIG. 7 is a cross-sectional view taken through lines 7—7 of FIG. 6.

As mentioned above, the subject invention includes four embodiments of burn-in sockets for the electrical connection between package leads of a four sided gull wing configured semiconductor package to electrical traces on a printed burn-in circuit board. In each of the embodiments of the burn-in socket, however, the semiconductor packages and the commercially available package carriers will be identical.

With reference first to FIG. 4, the semiconductor package 2 is shown where the package includes an insulating package body, such as 4, with a plurality of leads, such as 8, extending outwardly from the package body. The leads extend outwardly from the package body in a common plane and are then bent downwardly and formed into a foot, such as 10, which is in a plane below the lower surface of the package body 4.

With reference to FIG. 1, a carrier member, such as 12, would include four vertically upstanding walls, such as 14, which would include lower surfaces, such as 16 (FIG. 4), for retaining the foot portion of the semiconductor package lead in electrical engagement with the socket contacts.

With reference still to FIG. 1, the first embodiment of the burn-in socket 30 includes an insulating housing, such as 32, having an upper carrier receiving surface, such as 34, and a lower surface 36 which would be mounted in a facing relation to a printed circuit board. Two opposed side walls, such as 38, are included where four latching members 50 are secured in each of the four corners of the socket. The latching posts 50 are installed within a recess, such as 40, in the side walls 38 and are rotatable relative to the side walls. Each of the latching members includes a helical rampart, such as 52, and a stop member, such as 54.

With reference now to FIG. 4, the burn-in socket 30 further includes a plurality of laterally spaced terminal receiving cavities, such as 70, which extend between the upper 34 and lower 36 faces of the insulative housing 32. A plurality of terminals, such as 80, are inserted within each of the cavities where each of the terminals includes a body portion, such as 82, and an integral tail portion 88 extending beneath the lower surface and resilient contact portions, such as 84, which is reversely bent relative to the base portion 82 and includes an upper contact portion, such as 86. As shown in FIG. 4, the foot portion 10 of the semiconductor package lead 10 is trapped between the contact portion 86 and between the shoulder 16 of the carrier member.

To effect an electrical interconnection between the semiconductor leads of the package 2 and traces of a printed circuit board (not shown), the socket 30 would be first mounted to the printed circuit board in a known manner such as by soldering, or the like. The semiconductor package would then be inserted into the carrier with the package body being received through the opening formed by the four vertical walls from an underside thereof until the foot portions 10 of the semiconductor package leads 8 contact respective lower surfaces 16 of the package carrier 12. The package carrier 12, with the semiconductor package 2 inserted therein, would be placed within the burn-in socket 30 such that the package carrier is installed between the two opposed side walls 38. As shown in FIGS. 1 to 3, the rotatable latches 50 include flats such as 60 which, when rotated with the flats facing inwardly, will allow the acceptance of the carrier to pass into receipt within the semiconductor socket 30. When the flats are facing inwardly, for example, the stop members, such as 54, would be contacting the stop surface 46 of the recess 40. Once the carrier is installed within the socket 30, each of the rotatable posts can be pivoted about its axis with the use of a common tool, such as a screwdriver, and the helical rampart 52 will apply a vertical downward force against the carrier to effect vertical downward movement of the semiconductor package. The latching mechanism prevents the installer from overstressing the contacts as the stop surfaces 54 cannot rotate beyond interference with surface 48 of the recess 40, as shown in FIG. 1.

In the first embodiment of the invention, the helical ramparts 52 on the rotatable latches 50 directly contact the upper surfaces 22 of the carrier member which drive the carrier vertically downward. As the point of contact is between the helical rampart 52 and the carrier, and as the contact point is moved through a relatively long distance, that is through 180° of rotation, compared to a vertical downward deflection of the carrier of approximately 0.045 inches, a large mechanical advantage is available to assist the installer of the packages and carriers.

Figure 8:
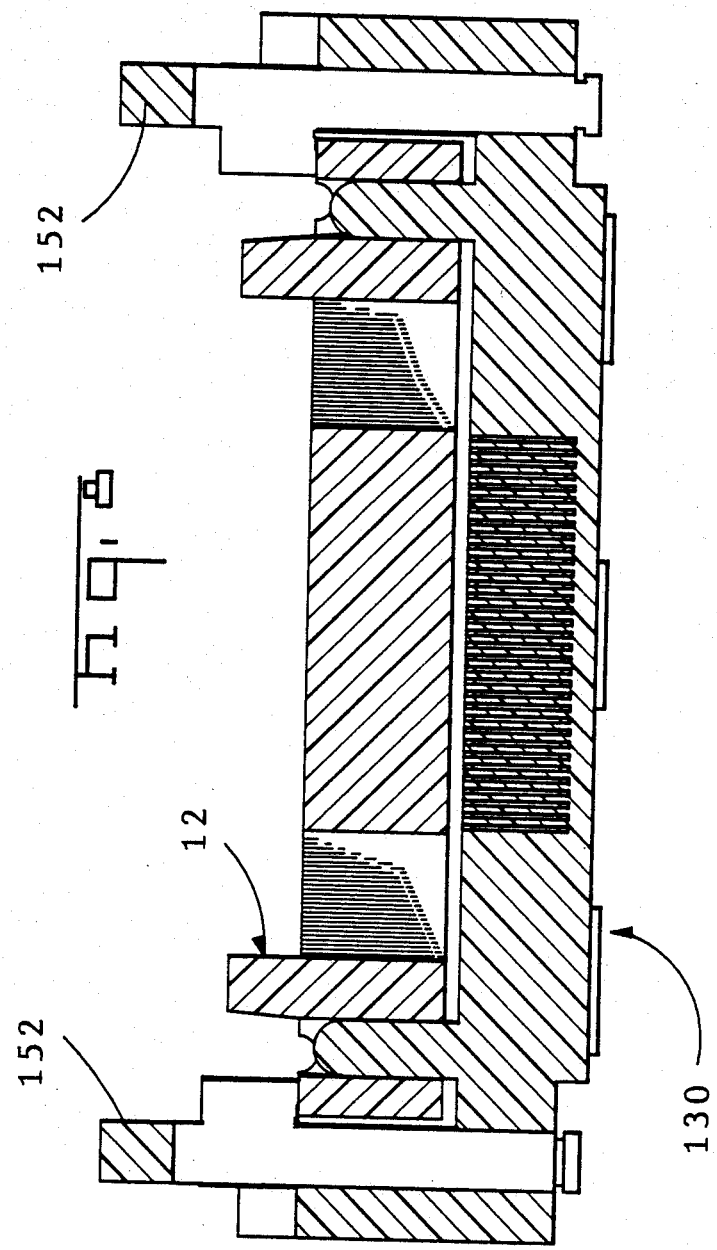
FIG. 8 is a cross-sectional view taken through lines 8—8 of FIG. 6.

The second embodiment of the inventive socket is shown in FIGS. 5-8. The socket is for all intents and purposes identical to the socket shown in FIGS. 1-4 but for the inclusion of wing nut handles 152 to the rotatable latches 150. This greatly simplifies the need for accessory tools for the installation of the carrier and the socket and further provides for an easy means to simultaneously and progressively move the socket vertically downward in a horizontal fashion. For example, when the carrier and the semiconductor package are placed within the burn-in socket 130 between the two opposed side walls, the two wing nut handles 152 in opposed corners can be turned which effects vertical downward movement against two corners simultaneously which effects the movement of the carrier and the socket in a planar fashion.

With reference now to FIGS. 9-11, a third embodiment of the burn-in socket will be described where the socket 230 includes a housing 232 having an upper face 234 for receipt of the carrier 12 and a lower surface 236 for applying to a printed circuit board. The housing 232 includes two opposed side walls, such as 238, with one side wall including two horizontally spaced apart hinges 240. A rotatable cover 250 is included which includes a single hinge 252 which is complementary and spaced between the two hinges 240 of the housing. In the preferred embodiment, the cover 250 would be stamped and formed from a sheet of metal and the hinge 252 would be formed by rolling the edge of the stamped metal into a partial cylindrical configuration. A hinge pin, such as 254, would complete the hinge assembly, thereby holding the cover 250 and the two hinge posts 240 in a hinged condition. A stop, such as 256, is included at the end of the cover 250 intermediate the hinge 252 to prevent the cover 250 from contacting adjacent burn-in sockets. At the opposite end of the cover 250 is a rotatable latch 260 and, as shown in FIG. 11, includes a latch post 262 having a helical rampart 264 integral with the post. The cover 250 includes two pairs of detents 258 (FIGS. 9 and 10) which define the fully open and the fully closed positions which prevent over rotation of the latch thereby preventing overstressing the contacts.

As shown in FIG. 10, when the door is rotated, the latch post 262 is disposed within a semicylindrical recess, such as 244, and the latching shoulder 242 extends partially around the semicylindrical recess 244. Thus, when the latch handle 266 is in the open condition, the end of the helical rampart 264 clears the shoulder 242 while rotation of the latch handle 266 begins clockwise rotation of the latch post 262 causing engagement between the helical rampart 264 and the latch shoulder 242.

Thus in the third embodiment of the invention, the helical rampart 264 contacts directly against the shoulder 242 of the housing 232 which effects the downward movement of the carrier and package. Once again, the helical rampart 264 moves through 180° of rotation to provide the mechanical advantage to the installer of the packages.

Referring now to FIGS. 12-14, the fourth embodiment of the burn-in socket will be described where the burn-in socket 330 includes an insulative housing 332 having an upper carrier receiving face 334 and a lower face 336 for placement against a printed circuit board. The housing 332 further comprises opposed side walls 338 where one of the side walls includes two spaced apart hinges 340 while the opposite side wall includes two spaced apart hinges 342.

An inner cover member 350 is included having a hinged portion 352 centrally located at one of its ends for receipt between the two hinges 340 while a pin, such as 354, is insertable through one end of the hinges 340 to lock the inner cover 350 to the housing 332. The inner cover 350 includes a stop 356 stamped from the hinge portion 352 which defines the outer extreme of rotation for the inner cover 350.

An outer cover, such as 360, includes a hinge 362 which is located intermediate the two hinges 342 with a pin, such as 364, being insertable through one of the hinges 342 for locking the outer cover 360 and the housing 332 together. Similarly, the outer cover 360 includes a stop 366 defining its outer rotational extreme.

As shown in FIG. 14, the inner cover 350 includes at its free end a recess or notch 370 extending along the front edge thereof. The outer cover includes a complementary detent 372 which conforms to the recess 370. The outer cover also includes a camming surface, such as 368, forward of the detent 372 for camming the inner cover into a closed position.

With reference now to FIG. 15, the installation of the carrier and the package will be described in greater detail. As mentioned above, the package will be installed within the carrier and the carrier will be placed within the socket with the carrier disposed between the side walls, and with both of the covers 350 and 360 open to their extremes. The inner cover 350 is lowered to a position where it rests upon the top surface of the carrier member and then the outer cover 360 is rotated in the opposite direction until the camming surface 368 comes into contact with the radius portion 376 of the inner surface. This point of contact is depicted in FIG. 15. With the two covers 350 and 360 in contact, the handle 374 of the outer cover 360 can be pushed downwardly towards the socket which applies a force between the camming surface 368 of the outer cover and the radius portion 376 of the inner cover. The inner cover will begin to close and the radius portion 376 of the inner cover 350 will slidably move relatively along the inner surface of the outer cover until the detent 372 and the recess 370 are in locking engagement. It should be noted that the center of the pin 364, which is the center of rotation of the outer cover, includes a vertical axis Y which passes through the contact point between the detent 372 and the recess 370, when the inner 350 and outer 360 covers are closed, which prevents the opening of the outer cover 360.

The inner cover 350 will have a spring force being applied against it which will try to rotate the cover in a clockwise direction when viewed from FIG. 14, the spring force being applied to the inner cover 350 by the multitude of resilient forces of the plurality of terminals against the package carrier and then to the cover 350. To maintain the inner cover 350 in a closed relation, an equal and opposite force must be applied to the inner cover. This equal and opposite force is applied by the outer cover 360 at the point where detent 372 of the outer cover 360 directly contacts the recess 370 of the inner cover. Advantageously, there is no moment attempting to open the outer cover 360 as the resultant forces between the two covers pass along the center of the pin 364. Said differently, even though a resilient force attempts to open the inner cover 350, and a resultant force from the outer cover 360 opposes that resilient force, the resultant forces between the inner 350 and outer 360 covers are in opposition and lie directly along the Y axis through the pin 364. Thus, taking the summation of the moments about the center of the pin 364 results in no moment on the outer cover 360 which will open the cover as the resultant force being applied by the inner cover at point 370 is directly through the center of the pin and no moment is applied where there is no moment arm relative to that center.

In the fourth embodiment, the two covers 350 and 360 are in contacting relation as shown in FIG. 15 which moves the carrier member vertically downward and the package into electrical connection with the socket contacts. The point of contact between the radius portion 376 of the inner cover 350 and the camming surface 368 of the outer cover 360 is along the vertical axis Y' as shown in FIG. 15. When a force F is applied to the handle 374, initially, a vertical component of the force $F_v$ is applied to the handle through a vertical axis Y" through a moment arm r. At this moment, the resultant spring force from the plurality of contacts onto the outer cover 360, via the inner cover 350 is at the vertical axis Y' through a moment arm r'. It should be noted that even at its worst condition, the socket 330 provides a great mechanical advantage to the installer. However, the mechanical advantage only gets better as the handle 374 and the outer cover are rotated clockwise. As the handle is rotated three factors contribute to the increase of the mechanical advantage. First, as the handle is rotated the vertical component of the force $F_v$ will increase. Secondly, the vertical component $F_v$ will act through a longer moment arm as the handle rotates, that is axis Y" moves to the right. Third, the contact point between the radius portion 376 and the inner surface 368 will also move, that is axis Y' also moves to the right. In fact when the outer cover 360 is fully closed to the position of FIG. 14, the Y axis and the Y' axis are one and the same which results in no moment arm r', thus the mechanical advantage actually goes to infinity.

The fourth embodiment also includes a positive stop to preclude overstressing the contacts in that the outer cover 360 can only rotate to the position shown in FIG. 14.

It has been shown that four embodiments of burn in sockets are capable of assisting in the installation of semiconductor packages by the inclusion of latching means which produce a mechanical advantage. Each of these embodiments also include means to prevent the overstressing of the contacts during such installation.

We claim:

1. An electrical connector for accepting a carrier member and a semiconductor package and for effecting an electrical interconnection between semiconductor package leads and traces of a printed circuit board, where the carrier member comprises an insulative material having an upper surface and a lower surface and a package receiving pocket therebetween with the semiconductor package body installed within the pocket, the electrical connector comprising:
   an insulative housing having an upper package receiving face and a lower mounting face, the housing having a plurality of laterally spaced terminal receiving cavities extending between the faces;
   a plurality of electrical terminals positioned within the cavities, the terminals including portions extending beyond the lower face for contact with the printed circuit board, and resilient contact portions which extend upwardly with at least a portion of the contact portion above the upper face; and
   latching means mounted to said connector being rotatable relative thereto and having a contacting surface, defined as a helical rampart, spaced from an axis of rotation for imparting a downward vertical force on said carrier to effect electrical connection between said package leads and said electrical terminals.

2. The connector of claim 1 wherein the latching means is mounted to, and upstands from, the housing and the rotation of the latching means causes the helical rampart to contact an upper surface of the carrier member.

3. The connector of claim 2 wherein the latching means comprises four rotatable latch posts disposed in corners of said housing.

4. The connector of claim 3 wherein the housing has a carrier receiving nest formed by the upper face and at least two opposed sidewalls which upstand from the upper face, and the four rotatable posts are mounted within said sidewalls.

5. An electrical connector for accepting a carrier member and a semiconductor package and for effecting an electrical interconnection between semiconductor package leads and traces of a printed circuit board, where the carrier member comprises an insulative material having an upper surface and a lower surface and a package receiving pocket therebetween with the semiconductor package body installed within the pocket, the electrical connector comprising:
   an insulative housing having an upper package receiving face and a lower mounting face, the housing having a plurality of laterally spaced terminal receiving cavities extending between the faces;
   a plurality of electrical terminals positioned within the cavities, the terminals including portions extending beyond the lower face for contact with the printed circuit board, and resilient contact portions which extend upwardly with at least a portion of the contact portion above the upper face;
   a cover member which is hinged along a side edge of the upper face and is rotatable between an upper extent in order to expose the upper face and between a position where the cover encloses the upper face; and
   a camming means which can be activated in order to effect a closure force on the cover member retaining the cover member in a closed configuration, the camming means including a post which is mounted to the cover member and rotatable relative thereto, the post including a helical rampart which is cooperable with a downwardly facing shoulder on the housing in order to cam the cover into a closed position.

6. An electrical connector for accepting a carrier member and a semiconductor package and for effecting an electrical interconnection between semiconductor package leads and traces of a printed circuit board, where the carrier member comprises an insulative material having an upper surface and a lower surface and a package receiving pocket therebetween with the semiconductor package body installed within the pocket, the electrical connector comprising:
   an insulative housing having an upper package receiving face and a lower mounting face, the housing having a plurality of laterally spaced terminal receiving cavities extending between the faces;
   a plurality of electrical terminals positioned within the cavities, the terminals including portions extending beyond the lower face for contact with the printed circuit board, and resilient contact portions which extent upwardly with at least a portion of the contact portion above the upper face; and
   latching means mounted to said connector being rotatable relative thereto and having a contacting surface means spaced from an axis of rotation for imparting a downward vertical force on said carrier to effect electrical connection between said package leads and said electrical terminals, the latching means including a cover which rotates relative to the housing to enclose the upper face, and which includes a rotatable post mounted to said cover having a helical rampart which contacts a downwardly facing surface on the housing thereby camming the cover downwardly.

7. An electrical connector for accepting a carrier member and a semiconductor package and for effecting an electrical interconnection between semiconductor package leads and traces of a printed circuit board, where the carrier member comprises an insulative material having an upper surface and a lower surface and a package receiving pocket therebetween with the semiconductor package body installed within the pocket, the electrical connector comprising:
   an insulative housing having an upper package receiving face and a lower mounting face, the housing having a plurality of laterally spaced terminal receiving cavities extending between the faces;
   a plurality of electrical terminals positioned within the cavities, the terminals including portions extending beyond the lower face for contact with the printed circuit board, and resilient contact portions which extend upwardly with at least a portion of the contact portion above the upper face;
   a cover member which is hinged along a side edge of the upper face and is rotatable between an upper extent in order to expose the upper face and between a position where the cover encloses the upper face; and
   a rotatable latch which rotates from an opposite side edge as the cover member, and rotates towards the cover member into an overlapping configuration therewith, the contact point between the cover member and the latch being in vertical alignment with an axis of rotation of the latch, whereby an upward spring force on the cover member is resisted by the latch maintaining the cover in a closed configuration.

* * * * *